(12) United States Patent
Salleh et al.

(10) Patent No.: US 6,973,003 B1
(45) Date of Patent: Dec. 6, 2005

(54) MEMORY DEVICE AND METHOD

(75) Inventors: Syahrizal Salleh, Johor (MY); Edward V. Bautista, Jr., Sunnyvale, CA (US); Ken Cheong Cheah, Penang (MY)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/677,073

(22) Filed: Oct. 1, 2003

(51) Int. Cl.$^7$ ............................................... G11C 7/00
(52) U.S. Cl. ................................ 365/222; 365/189.05
(58) Field of Search ........................... 365/222, 189.08, 365/185.03, 185.22, 185.29, 189.05, 233

(56) References Cited

U.S. PATENT DOCUMENTS

| | | | |
|---|---|---|---|
| 4,277,838 A * | 7/1981 | Chambers | 365/222 |
| 4,317,169 A * | 2/1982 | Panepinto et al. | 365/222 |
| 4,322,819 A * | 3/1982 | Hyatt | 365/222 |
| 5,365,486 A * | 11/1994 | Schreck | 365/222 |
| 5,511,020 A * | 4/1996 | Hu et al. | 365/222 |
| 6,324,108 B1 | 11/2001 | Bill et al. | |
| 6,459,628 B1 | 10/2002 | Bautista, Jr. et al. | |
| 6,532,175 B1 | 3/2003 | Yachareni et al. | |
| 6,535,424 B2 | 3/2003 | Le et al. | |
| 6,549,477 B1 | 4/2003 | Bautista, Jr. et al. | |
| 6,550,028 B1 | 4/2003 | Akaogi et al. | |
| 6,570,801 B2 * | 5/2003 | Yoshida et al. | 365/222 |
| 6,646,943 B2 * | 11/2003 | Kim | 365/222 |
| 6,754,126 B2 * | 6/2004 | Yamaguchi et al. | 365/222 |
| 2001/0048613 A1 | 12/2001 | Al-Shamma et al. | |
| 2002/0012278 A1 | 1/2002 | Akaogi et al. | |

* cited by examiner

*Primary Examiner*—Trong Phan
(74) *Attorney, Agent, or Firm*—Paul Drake; Rennie Wm. Dover

(57) ABSTRACT

A memory device and a method for refreshing the memory device. The memory device includes a memory cell capable of storing two bits of data. One bit is referred to as the normal data bit and the other bit is referred to as the complementary data bit. Each memory cell has an associated dynamic reference cell. The normal data is refreshed by latching refresh data into a data latch and ORing the latched data with input data. The refresh data is written to the corresponding memory location. The data for the complementary data bit is refreshed by latching complementary data bit refresh data into the complementary data latches and writing to the memory cell. The normal and complementary data bits are refreshed before each read operation.

24 Claims, 4 Drawing Sheets

MEMORY DEVICE AND METHOD

FIELD OF THE INVENTION

This invention relates, in general, to memory devices and, more particularly, to memory devices having a flash architecture.

BACKGROUND OF THE INVENTION

Memory devices are used in a variety of electronic systems including computers, cellular phones, pagers, personal digital assistants, avionic systems, automotive systems, industrial control systems, appliances, etc. Depending on the particular system configuration, the memory devices may be either non-volatile or volatile. A non-volatile memory device retains the data or instructions stored therein when the device is turned off or power is removed. A volatile memory device, on the other hand, does not retain the stored data or instructions when the device is turned off. Flash memory has become an important type of non-volatile memory because it is less expensive to manufacture and denser than most other types of memory devices. In addition, Flash memory is electrically erasable and has a life span of up to one million write cycles.

A newer type of Flash memory, known as MirrorBit™ Flash memory, includes a memory cell that is essentially split into two identical (mirrored) parts where each part stores one of two independent bits. A MirrorBit™ Flash memory cell comprises a semiconductor substrate having source and drain regions and a control gate spaced apart from the semiconductor substrate by a multilayer dielectric structure referred to as a "charge-trapping dielectric layer." A polysilicon layer is disposed over the charge-trapping dielectric layer and serves as the control gate. A MirrorBit™ Flash memory cell is programmed by applying a high voltage to the control gate and connecting the source to ground and the drain to a predetermined potential above the potential applied to the source, i.e., above ground potential. During programming, electrons are injected into and removed from the charge-trapping dielectric layer, which causes the threshold voltage, VT, of the MirrorBit™ Flash memory cell to vary. Unlike conventional Flash memory cells, the source and drain of a MirrorBit™ Flash memory cell can be reversed during operation to permit the storing of two bits. Because this type of memory cell is capable of storing two bits, one of the bits is referred to as the normal bit and the other bit is referred to as the complementary bit.

Once a MirrorBit™ Flash memory cell has been programmed, its threshold voltage should remain stable indefinitely, unless the memory cell is erased. However, programming the memory cell and performing a read operation on the programmed memory cell or on adjacent memory cells causes the programmed memory cell to lose charge, which results in its threshold voltage drifting to a lower value. To account for the drift in threshold voltage, the memory cell has been configured to include a dynamic reference cell which has a reference threshold voltage that tracks with the threshold voltage of the programmed memory cell. The dynamic reference cell ensures that the correct data is always being read from the memory cell. When the memory cell for a particular address is programmed, the dynamic reference cell is also programmed, thereby ensuring that the threshold voltage of the dynamic reference cell tracks with the threshold voltage of the memory cell. A drawback of this type of memory cell configuration is that the dynamic reference cell is shared by both the normal bit and the complementary bit. Thus, programming the dynamic reference cell may shift the reference threshold voltage relative to the threshold voltage for the complementary bit.

Accordingly, what is needed is a method and structure for ensuring that the threshold voltage of the dynamic reference cell tracks with the threshold voltages of the normal and complementary bits.

SUMMARY OF THE INVENTION

The present invention satisfies the foregoing need by providing a memory device and a method for refreshing the memory device that mitigates the effects associated with programming memory cells. In accordance with one aspect, the present invention comprises a method for refreshing a memory device while programming user data. A memory cell having first and second memory locations is provided. A first updated latch value is generated and written to the first memory location. A second updated latch value is generated and written to the second memory location. For example, a value of a first memory location is latched and ORed with data input by a user to generate the first updated latch value. The second updated latch value is derived from a second memory location that stores the complementary bits of the memory device.

In accordance with yet another aspect, the present invention comprises a method for operating a memory device, wherein a normal bit of a byte stored in the memory device is refreshed and the complementary bit of the byte stored in the memory device is refreshed.

In accordance with yet another aspect, the present invention comprises a method for refreshing a memory device having a data latch, a complementary data latch, and a write latch. First and second control signals are applied to the data latch to latch a stored memory value. A logic operation is performed on the memory value and the data value to generate a refresh value. The refresh value is transmitted to an output terminal of the write latch. The first control signal and a third control signal are applied to the complementary data latch to latch a stored complementary refresh value. The complementary refresh value is transmitted to the output terminal of the write latch.

In accordance with yet another aspect, the present invention includes a memory device comprising a first latching circuit having an input terminal, a first control terminal coupled for receiving a first control signal, a second control terminal coupled for receiving a second control signal, a third control terminal coupled for receiving a third control signal, and an output terminal. In addition, the memory device includes a second latching circuit having a first control terminal coupled for receiving a first complementary control signal, a second control terminal coupled for receiving a second complementary control signal, a third control terminal coupled for receiving a third complementary control signal, and an output terminal, wherein the output terminal of the second latching circuit is coupled to the output terminal of the first latching circuit to form a common output terminal.

In accordance with yet another aspect, the present invention includes a memory device comprising an input circuit coupled to a latch circuit and a complementary latch circuit coupled to the latch circuit. An input node of the latch circuit is coupled to the output terminal of the input circuit. A latching node of the complementary latch circuit is coupled to the output terminal of the latch circuit and the output terminal of the complementary latch circuit is connected to the output terminal of the latch circuit.

BRIEF DESCRIPTION OF THE DRAWINGS

The present invention will be better understood from a reading of the following detailed description, taken in conjunction with the accompanying drawing figures, in which like reference numbers designate like elements, and in which.

DETAILED DESCRIPTION

Figure 1:
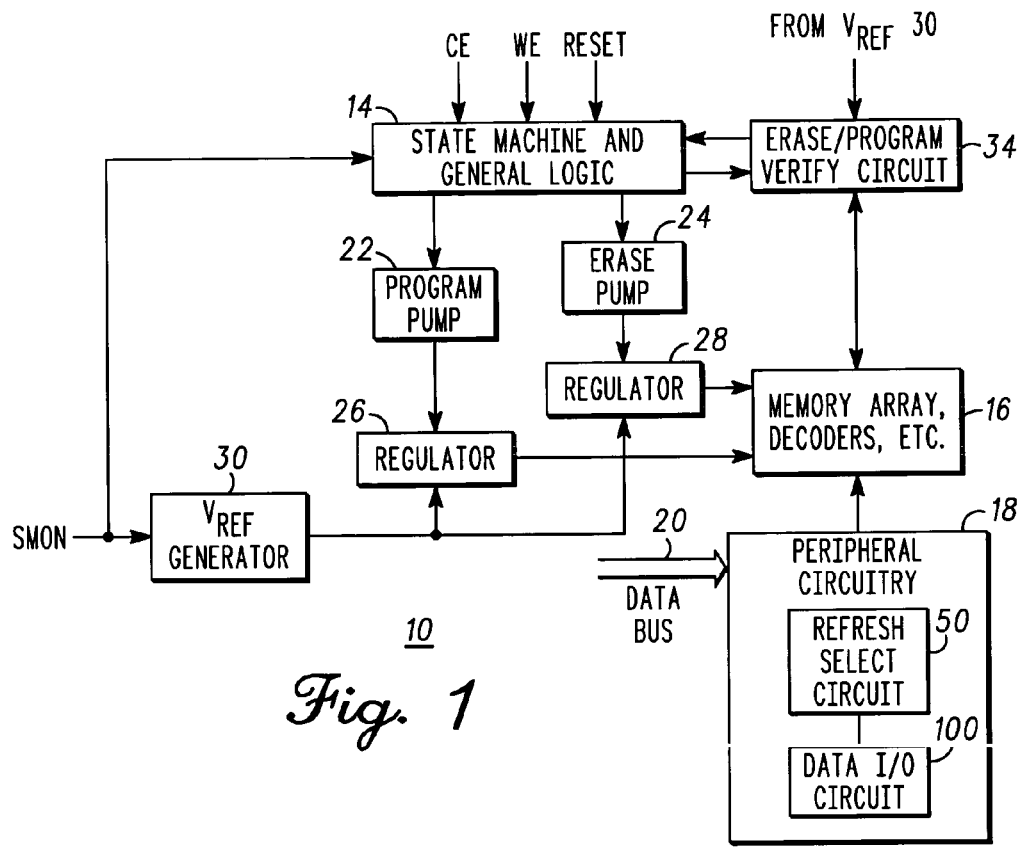
FIG. 1 is block diagram of a memory system having a data input-output (I/O) circuit in accordance with an embodiment of the present invention.

FIG. 1 is a block diagram of a memory system 10 incorporating a complementary data refresh element in accordance with an embodiment of the present invention. Memory system 10 is part of an integrated circuit memory chip. For purposes of simplicity of explanation, memory system 10 will be described in the context of Flash memory, although one skilled in the art will understand and appreciate that other types of circuits such as, for example, a dynamic random access memory (DRAM) chip, a static random access memory (SRAM) chip, an electrically erasable and programmable read only memory (EEPROM) chip, also may include a complementary data refresh element in accordance with an embodiment of the present invention.

Memory system 10 includes a state machine and general logic block 14 for controlling operation of memory system 10. State machine 14 is coupled to a program pump 22 and to an erase pump 24 for respectively implementing program and erase operations relative to a memory block 16. For example, pumps 22 and 24 each receive a voltage control channel (VCC) signal to supply a boosted voltage. Pumps 22 and 24 are further coupled to regulator circuits 26 and 28, respectively, and transfer high voltage signals to their associated regulator circuits. Voltage regulator circuits 26 and 28 receive a reference voltage signal from a reference voltage generator 30, which is activated in response to a State Machine On (SMON) signal. Typically, the reference voltage signal from reference voltage generator 30 ramps up to a desired voltage level upon beginning a program/erase operation or a program/erase verify operation. Regulator circuits 26 and 28 are coupled to memory block 16 and, in particular, to the decoders comprising memory block 16. Regulator circuits 26 and 28 produce controlled voltage signals based on the reference voltage, which controlled voltage signals are selectively applied to the sources of the floating gate memory cells.

State machine 14 is also coupled to an erase/program verify circuit 34 for providing a VERIFY control signal to initiate a verify operation. For example, state machine 14 is programmed and/or configured to activate verify circuit 34 after every programming and erase operation in order to assure the selected cell(s) have been effectively programmed or erased. Erase/program verify circuit 34 is operable to receive the reference voltage signal from reference voltage generator 30 and generate erase verify voltage signals and program verify voltage signals, respectively, based on the reference voltage signal. Such verify signals are then selectively applied to the memory cells during a verify operation of the appropriate memory cell. Verify circuit 34 provides the results of the program verify operation to state machine 14.

State machine 14 controls the operation of pumps 22 and 24 in dependence on the control signals it receives. In other words, state machine 14 receives a plurality of input signals and controls operation of memory system 10 in accordance with these signals. For example, state machine 14 receives a Chip Enable (CE) signal, a Write Enable (WE) signal, and a RESET signal. State machine 14 also receives the SMON signal from an associated processor or other device, wherein the SMON signal controls activation of state machine 14.

State machine 14 is operably coupled to a memory block 16 and programmed and/or configured to control the processes of storing charge on and removing charge from floating gate memory cells (not shown) of memory block 16. For example, state machine 14 controls the operation of memory block 16 in response to incoming command and control signals on control lines, such as from an associated processor (not shown). Memory block 16 includes decoders that are operable to program and erase cells of the flash memory upon receiving appropriate control signals. By way of example, memory block 16 includes a flash EEPROM comprising an array of memory cells and decoders for controlling which part of the memory array is to be accessed, such as for programming, erasing, and/or verifying operations in accordance with an embodiment of the present invention. More particularly, memory block 16 includes a core array which is made up of an M×N array of flash memory cells. A word line and control line driver provides appropriate control voltages to the core array via a plurality of word lines. Such control voltages allow data to be stored in, read from or erased from the memory cells. A bit line driver provides appropriate control voltages to and/or receives an output signal from a plurality of bit lines within the core array.

Memory system 10 further includes peripheral circuitry 18 which receives data via a data bus 20. Peripheral circuitry 18 includes a refresh select circuit 50 and a data I/O circuit 100. Because data is stored in the form of a word comprising a plurality of bits, data I/O circuit 100 is comprised of a plurality of I/O buffers, where each buffer receives one bit of the word. Thus, for a sixteen bit word, there are sixteen I/O buffers. The I/O buffers are configured to form two eight bit bytes which are typically referred to as the low byte of the word and the high byte of the word. Refresh select circuit 50 controls whether the low byte, the high byte, or the entire word is programmed, erased, or refreshed. It should be understood by those skilled in the art that peripheral circuitry 18 includes other types of circuitry such as, for example, an address decoder and a reference cell array. However, the additional elements of peripheral circuitry 18 are not shown for the sake of brevity.

Figure 2:
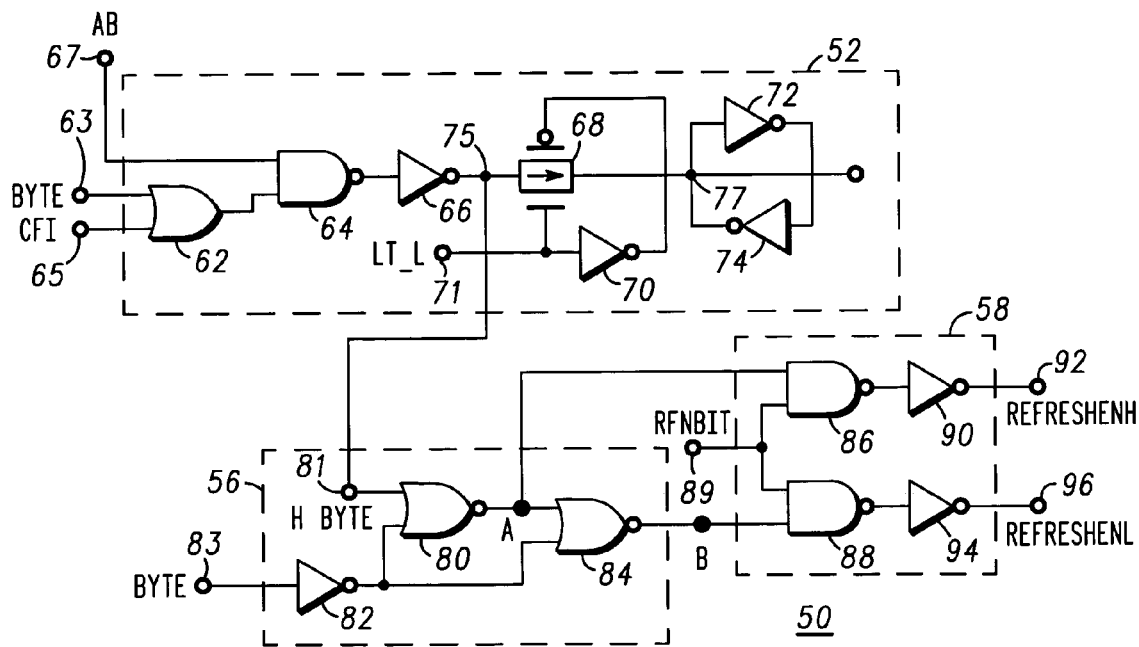
FIG. 2 is a schematic diagram of a refresh select circuit of the memory system of FIG. 1 in accordance with an embodiment of the present invention.

Referring now to FIG. 2, a schematic diagram of refresh select circuit 50 in accordance with an embodiment of the present invention is shown. Refresh select circuit 50 selects either the high byte, the low byte, or the entire word to be refreshed. Refresh select circuit 50 comprises a latch 52 coupled to a byte disable circuit 56, which byte disable circuit 56 is coupled to a refresh enable circuit 58. By way of example, latch 52 is comprised of a two-input OR gate 62 having one input terminal 63 coupled for receiving a control signal, BYTE, and the other input terminal 65 coupled for receiving a control signal, CFI. The output terminal of OR gate 62 is connected to one input terminal of a two-input NAND gate 64. The second input terminal 67 of NAND gate 64 is coupled for receiving an address selection signal AB. The output terminal of NAND gate 64 is connected to an input terminal of an inverter 66 and the output terminal of inverter 66 is connected to a complementary passgate 68. Passgate 68 has a control terminal coupled for receiving a control signal LT_L at input terminal 71 and a complementary control terminal coupled for receiving control signal LT_L through an inverter 70. An output terminal of passgate 68 is connected to a buffer circuit and to an output terminal of latch 52 at node 77. The buffer circuit comprises a pair of series connected inverters 72 and 74.

The output terminal of inverter 66 is connected to an input terminal 81 of byte disable circuit 56 at node 75, which input terminal 81 serves as an input terminal of a two-input NOR gate 80. An input terminal 83 of byte disable circuit 56 is coupled for receiving the control signal BYTE. In addition, input terminal 83 is coupled to the second input terminal of NOR gate 80 through an inverter 82. The output terminal of inverter 82 is connected to an input terminal of a two-input NOR gate 84. The output terminal of NOR gate 80 is connected to the second input terminal of NOR gate 84 and to an input terminal of refresh enable circuit 58 at node A. The output terminal of NOR gate 84 is coupled to another input terminal of refresh enable circuit 58 at node B. Refresh enable circuit 58 comprises a two-input NAND gate 86 having an input terminal commonly connected to an input terminal of a NAND gate 88, wherein the commonly connected input terminals serve as an input terminal 89 of refresh enable circuit 58. Input terminal 89 is coupled for receiving a refresh enable control signal RFNBIT. The second input terminal of NAND gate 86 serves as an input terminal of refresh enable circuit 58 and the second input terminal of NAND gate 88 serves as another input terminal of refresh enable circuit 58. The output terminal of NAND gate 86 is coupled to an output terminal 92 through an inverter 90 and the output terminal of NAND gate 88 is coupled to an output terminal 96 through an inverter 94. Output terminal 92 is coupled for transmitting a refresh enable signal RFRESHENH to enable refreshing the high byte, i.e., bits 8–15 of a sixteen bit word, and output terminal 96 is coupled for transmitting a refresh enable signal RFRESHENL to enable refreshing the low byte, i.e., bits 0–7 of the sixteen bit word.

Figure 3:
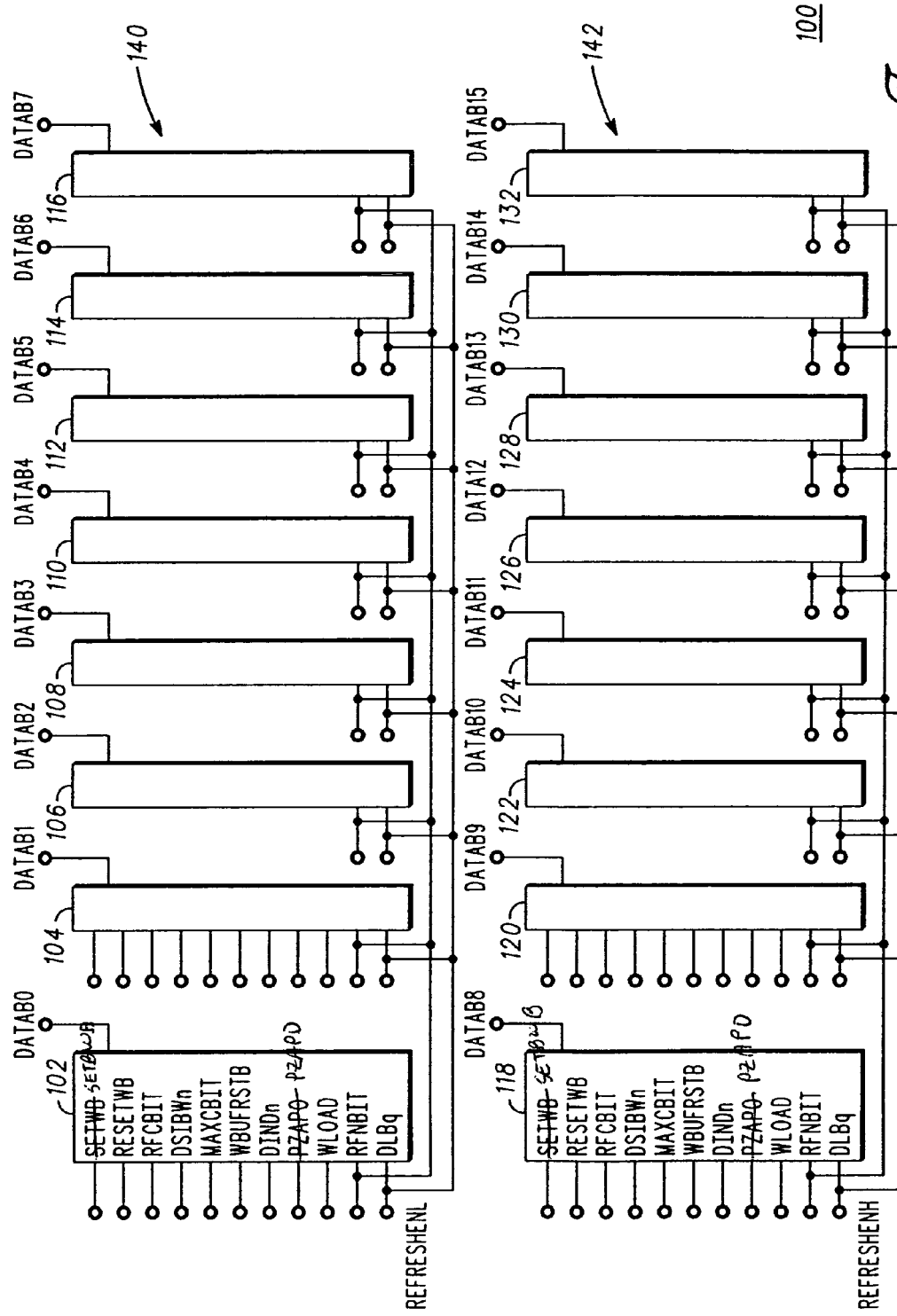
FIG. 3 is a block diagram of a data I/O circuit of the memory system of FIG. 1 in accordance with an embodiment of the present invention.

Referring now to FIG. 3, a block diagram of data I/O circuit 100 in accordance with an embodiment of the present invention is shown. Data I/O circuit 100 comprises a plurality of I/O buffer circuits 102, 104, 106, 108, 110, 112, 114, 116, 118, 120, 122, 124, 126, 128, 130, and 132. I/O buffer circuits 102–116 are substantially identical and cooperate to form a low byte 140 of a sixteen bit word and I/O buffer circuits 118–132 are substantially identical and cooperate to form a high byte 142 of the sixteen bit word. In other words, I/O buffer circuits 102–116 correspond to bits 0–7 and I/O buffer circuits 118–132 correspond to bits 8–15 of the sixteen bit word. Low byte 140 is coupled for receiving a select signal RFRESHENL and high byte 142 is coupled for receiving select signal RFRESHENH from refresh select circuit 50. Each I/O buffer circuit 102–132 has an output terminal coupled for transmitting an output signal DATABn, where the letter "n" denotes the particular bit of the word. Each I/O buffer circuit comprises a data latching portion 200 and a write latching portion 300, where data latching portion 200 is further described with reference to FIG. 4 and write latching portion 300 is further described with reference to FIG. 5. It should be understood that each I/O buffer circuit 102–132 is structurally identical and that they differ only in the particular bits of a word they represent. Therefore, for the sake of clarity, only the input and output terminals for I/O buffer circuits 102 and 118 have been labeled.

Figure 4:
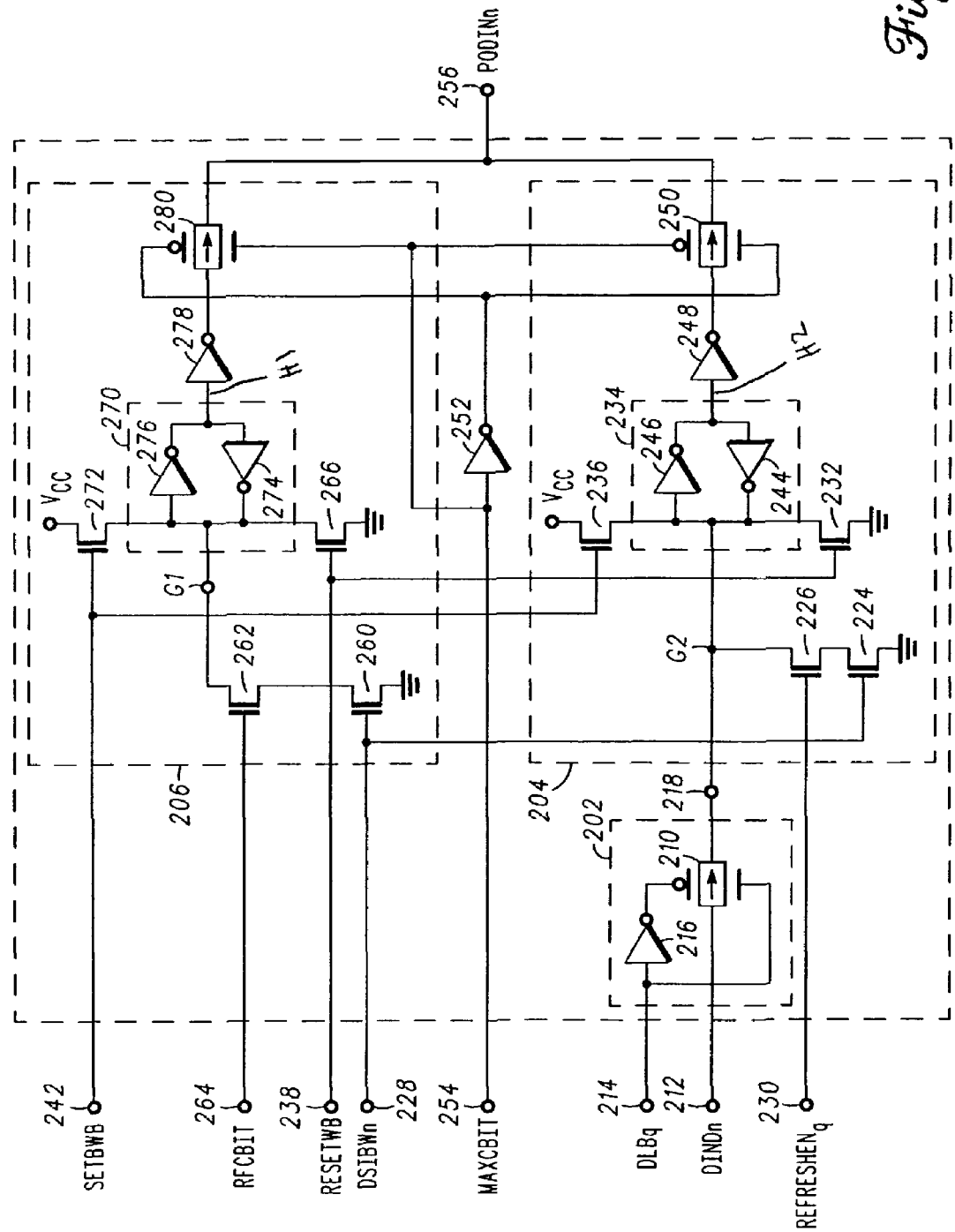
FIG. 4 is a schematic diagram of a data latching portion of the data I/O circuit of FIG. 3 in accordance with an embodiment of the present invention.

Referring now to FIG. 4, a schematic diagram of data latching portions 200 of I/O buffer circuits 102–132 is shown. As described with reference to FIG. 3, the number of I/O buffer circuits 102–132 is typically dependent on the length of the word being stored, erased, or refreshed. Each I/O buffer circuit 102–132 comprises an input gating circuit 202 and a complementary data latch 206 coupled to data latch 204. Input gating circuit 202 comprises a complementary passgate 210 coupled for receiving a data signal DINDn at an input terminal 212. Passgate 210 has a control terminal coupled for receiving a control signal DLBq at terminal 214 and a complementary control terminal coupled for receiving control signal DLBq through an inverter 216. Gating circuit 202 has an output terminal 218 through which data signal DINDn is transmitted when passgate 210 is in an "open" configuration. It should be noted that the letter "n" appended to the name DIND represents an integer that identifies the bit of the word to which the control signal corresponds. For example, DIND0 is the control signal corresponding to bit 0, DIND1 is the control signal corresponding to bit 1, DIND2 is the control signal corresponding to bit 2, etc. Similarly, the letter "q" appended to the name DLB is a shorthand notation indicating whether the control signal corresponds to the high byte or the low byte of the word. More particularly, when the letter "q" is replaced by the letter "L" (i.e., DLBL) the control signal corresponds to the low byte of the word and when the letter "q" is replaced by the letter "H" (i.e., DLBH) the control signal corresponds to the high byte of the word.

Data latch 204 comprises series connected insulated gate field effect transistors 224 and 226, where a source electrode of transistor 224 is coupled for receiving a source of operating potential such as, for example, $V_{SS}$, and the drain electrode of transistor 224 is connected to the source electrode of transistor 226. The gate electrode of transistor 224 is coupled for receiving a status control signal, DSIBWn, at input terminal 228 and the gate electrode of transistor 226 is coupled for receiving a refresh enable signal, RFRESHENq, at input terminal 230. Refresh enable signal RFRESHENq is obtained from output terminals 92 and 96 of refresh select circuit 50. It should be noted that the letter "n" appended to the name DSIBW represents an integer that identifies the bit of the word to which the control signal corresponds. For example, DSIBW0 is the control signal corresponding to bit 0, DSIBW1 is the control signal corresponding to bit 1, DSIBW2 is the control signal corresponding to bit 2, etc. Similarly, the letter "q" appended to the name RFRESHEN is a shorthand notation indicating whether the refresh enable signal refers to the low byte or the high byte of the word. More particularly, when the letter "q" is replaced by the letter "L" (i.e., RFRESHENL) the refresh signal corresponds to the low byte of the word and when the letter "q" is replaced by the letter "H" (i.e., RFRESHENH) the refresh enable signal corresponds to the high byte of the word.

The drain electrode of transistor 226 is commonly connected to a drain electrode of an insulated gate field effect transistor 232, an input of a latch 234, a source electrode of an insulated gate field effect transistor 236, and output terminal 218 of a gating circuit 202 at node G2. A source electrode of transistor 232 is coupled for receiving a source of operating potential such as, for example, $V_{SS}$, and the gate electrode of transistor 232 is coupled for receiving reset signal RESETWB at an input terminal 238. The drain electrode of transistor 236 is coupled for receiving a source of operating potential such as for example, $V_{CC}$, and the gate electrode of transistor 236 is coupled for receiving a control signal SETBWB at an input terminal 242.

An exemplary range of voltages for $V_{CC}$ is from approximately 2.5 volts to approximately 4 volts and an exemplary range of voltages for $V_{SS}$ is from approximately −0.5 volts to approximately 0.5 volts. By way of example, sources of operating potential $V_{CC}$ and $V_{SS}$ are 3 volts and ground, respectively.

Latch 234 comprises a pair of inverters 244 and 246 coupled such that the output terminal of inverter 244 is connected to the input terminal of inverter 246 to form the input terminal of latch 234 and the output terminal of inverter 246 is connected to the input terminal of inverter 244 to form the output terminal of latch 234. The output terminal of latch 234 is coupled to an input terminal of a complementary passgate 250 through an inverter 248. Passgate 250 has a control terminal coupled for receiving a control signal MAXCBIT through an inverter 252 and a complementary control terminal coupled for receiving control signal MAXCBIT from terminal 254. The output terminal of pass-gate 250 is coupled for transmitting a data signal PODINn at output terminal 256 when passgate 250 is in an "open" configuration. It should be understood that similar to the status control signal DSIBW, the letter "n" is appended to the name of output data signal PODIN to indicate the particular bit to which the input data signal corresponds.

Complementary data latch 206 comprises series connected insulated gate field effect transistors 260 and 262, where a source electrode of transistor 260 is coupled for receiving a source of operating potential such as, for example, $V_{SS}$, and the drain electrode of transistor 260 is connected to the source electrode of transistor 262. The gate electrode of transistor 260 is coupled for receiving a status control signal, DSIBWn, at input terminal 228 and the gate electrode of transistor 262 is coupled for receiving a refresh enable signal, RFCBIT, at input terminal 264.

The drain electrode of transistor 262 is commonly connected to a drain electrode of an insulated gate field effect transistor 266, an input of a latch 270, and to a source electrode of an insulated gate field effect transistor 272 at node G1. A source electrode of transistor 266 is coupled for receiving a source of operating potential such as, for example, $V_{SS}$, and the gate electrode of transistor 266 is coupled for receiving a reset signal, RESETWB at terminal 238. The drain electrode of transistor 272 is coupled for receiving a source of operating potential such as, for example, $V_{CC}$ and the gate electrode of transistor 272 is coupled for receiving a control signal SETBWB at terminal 242.

Latch 270 comprises a pair of inverters 274 and 276 coupled such that the output terminal of inverter 274 is connected to the input terminal of inverter 276 to form the input terminal of latch 270 and the output terminal of inverter 276 is connected to the input terminal of inverter 274 to form the output terminal of latch 270. The output terminal of latch 270 is coupled to an input terminal of a complementary passgate 280 through an inverter 278. Passgate 280 has a control terminal coupled for receiving a control signal MAXCBIT from terminal 254 and a complementary control terminal coupled through an inverter 252 for receiving control signal MAXCBIT. The output terminal of passgate 280 is coupled to output terminal 256 for transmitting the data signal PODINn. It should be noted that the output terminal of passgate 280 is also connected to the output terminal of passgate 250. When I/O data signal PODINn is transmitted from passgate 250 it is a refresh signal for the normal data bits, whereas when I/O data signal PODINn is transmitted from passgate 280 it is a refresh signal for the complementary data bits.

Figure 5:
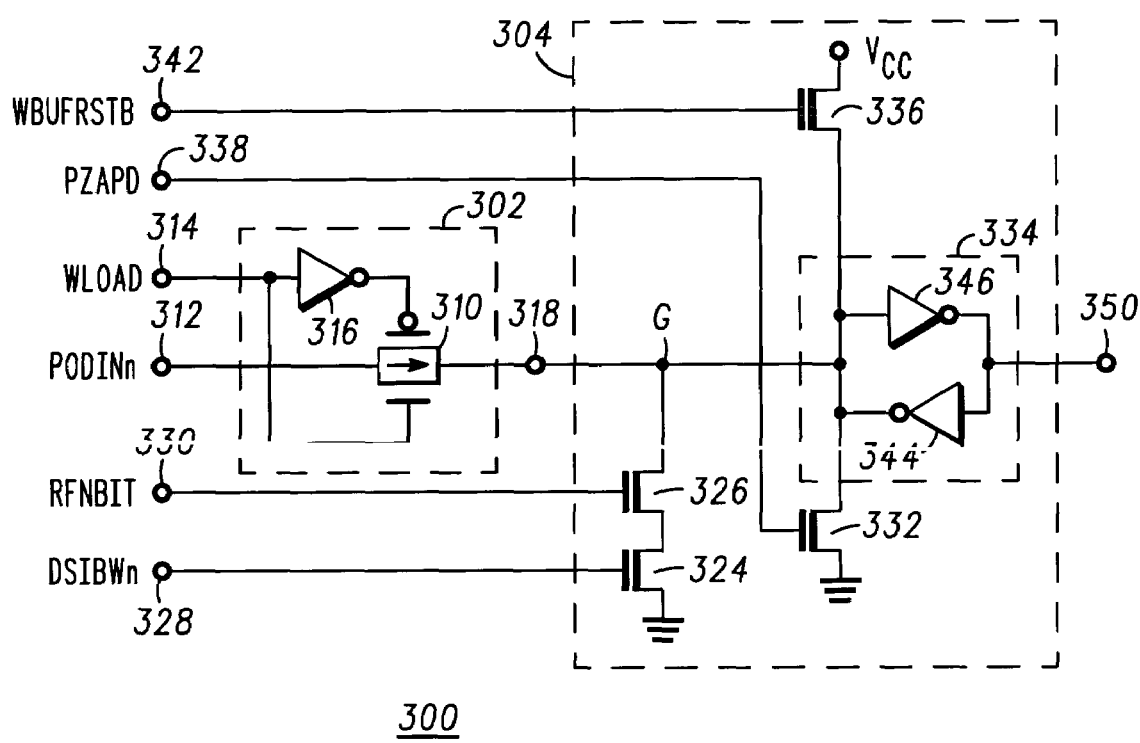
FIG. 5 is a schematic diagram of a write latching portion of the data I/O circuit of FIG. 3 in accordance with an embodiment of the present invention.

Referring now to FIG. 5, a schematic diagram of a write latching portion 300 of I/O buffer circuits 102–132 is shown. Each write latching portion 300 comprises an input gating circuit 302 coupled to a write latching portion 304. Input gating circuit 302 comprises a complementary passgate 310 coupled for receiving I/O data signal PODINn at an input terminal 312. Passgate 310 has a control terminal coupled for receiving a control signal WLOAD at terminal 314 and a complementary control terminal coupled through an inverter 316 for receiving control signal WLOAD. Gating circuit 302 has an output terminal 318 through which I/O data signal PODINn is transmitted when passgate 310 is in an "open" configuration.

Data latch 304 comprises series connected insulated gate field effect transistors 324 and 326, where a source electrode of transistor 324 is coupled for receiving a source of operating potential such as, for example, $V_{SS}$, and the drain electrode of transistor 324 is connected to the source electrode of transistor 326. The gate electrode of transistor 324 is coupled for receiving status control signal DSIBWn at input terminal 328 and the gate electrode of transistor 326 is coupled for receiving refresh enable signal RFNBIT at input terminal 330.

The drain electrode of transistor 326 is commonly connected to a drain electrode of an insulated gate field effect transistor 332, an input of a latch 334, a source electrode of an insulated gate field effect transistor 336, and output terminal 318 of a gating circuit 302 at node G. A source electrode of transistor 332 is coupled for receiving a source of operating potential such as, for example, $V_{SS}$ and the gate electrode of transistor 332 is coupled for receiving reset signal PZAPD at input terminal 338. The drain electrode of transistor 336 is coupled for receiving a source of operating potential such as for example, $V_{CC}$, and the gate electrode of transistor 336 is coupled for receiving a control signal WBUFRSTB at input terminal 342.

Latch 334 comprises a pair of inverters 344 and 346 coupled such that the output terminal of inverter 344 is connected to the input terminal of inverter 346 to form the input terminal of latch 334 and the output terminal of inverter 346 is connected to the input terminal of inverter 344 to form output terminal 350 of latch 334. Output terminal 350 serves as the output terminal of write latching portion 300.

In operation, state machine 14 generates a control signal indicating whether the refresh operation will occur in user BYTE mode programming or in user WORD mode programming. In user BYTE mode programming, a low byte of a stored word, i.e., bits 0–7, is refreshed during a clock cycle and the high byte of the stored word, i.e., bits 8–15, is refreshed during the subsequent clock cycle. Alternatively, the high byte of the stored word may be refreshed during a clock cycle, then the low byte of the stored word may be refreshed during the subsequent clock cycle. Thus, the order of the refresh operation during user BYTE mode programming is not a limitation of the present invention. In user WORD mode programming, the whole word is latched into data I/O circuit 100. Since the input user data is a word, there is no need to refresh the normal bits. Because of the cell construction of the MirrorBit™ memory devices, each cell stores two bits. The bit refreshed using data latching circuit 204 is referred to as the normal bit and the bit refreshed using latching circuit 206 is referred to as the complementary bit.

In Byte mode programming, before programming begins a refresh read step is performed to determine which bits need to be refreshed. In an embodiment in which the high byte of the stored word is refreshed before the low byte of the stored word is refreshed, a read refresh step is performed to refresh the high byte of the stored word. Thus, control signal DLBH is maintained at a logic low voltage level so that pass-gates 210 of the corresponding I/O buffer circuits 118–132, i.e., the high byte, are not opened. For bits of the high byte of the stored word that have been programmed and are to be refreshed, status control signal DSIBWn is raised to a logic high voltage level. A logic low voltage level is also referred to as a logic low level and a logic high voltage level is also referred to as a logic high level. By way of example, a logic low level ranges from approximately –0.5 volts to approximately 1.8 volts and a logic high level ranges from approximately 2.5 volts to approximately 4 volts. In addition, enable signals RFNBIT and RFRESHENH are pulsed to a logic high level and enable signal RFRESHENL is maintained at a logic low level. More particularly, enable signal RFNBIT is pulsed to a logic high level during the first half of a first clock cycle, thereby placing memory system 10 in the READ refresh mode to refresh the normal bits of the high byte. Likewise, during the first half of the first clock cycle RFRESHENH is pulsed to a logic high level to allow the bits located in the high byte of the stored word having a logic low or zero value to set corresponding latches 204 in I/O buffer circuits 118–132. For example, if bit n has been programmed, status control signal DSIBWn is set to a logic high level, refresh enable signal RFRESHENH is pulsed to a logic high level and a logic low or zero is stored at node G2. Control signal DLBH is pulsed high to allow input data DINDn to be ORed with the logic low value appearing at node G2 to generate an updated latch value. This updated latch value is also referred to as a refresh value. Thus a logic operation, i.e., an Oring operation, is performed on a value from the first memory location, i.e., the value appearing at node G2 and data value DINDn. The refresh value appearing at node G2 is inverted by latch 234 and appears at node H2. The inverted signal appearing at node H2 is inverted by inverter 248 and transmitted to output terminal 256 via passgate 250, which is activated by setting signal control signal MAXCBIT to a logic low level and control signal MAXCBITB to a logic high level. Thus, the logic low level refresh signal stored at node G2 is transmitted to output terminal 256 where it is referred to as input/output (I/O) signal PODINn. I/O signal PODINn serves as an input signal at input terminal 312 of write latching portion 300 (shown in FIG. 5).

During the second half of the first clock cycle, enable signal WLOAD is pulsed to a logic high level and enable signal RFNBIT is set to a logic low level, thereby latching the refresh signal in write latching portion 300. In other words, passgate 310 is opened and the refresh signal is transferred to node G, latched by latch 334, and appears at output terminal 350 as output signal DOUTDn. Output signal DOUTDn updates or refreshes the corresponding bit of the word. Thus, the updated latch value is written from data I/O circuit 100 to a memory location in memory array 16 in response to enable or control signal DSIBWn which is indicative of the data value and in response to enable or control signal RFNBIT which is indicative of the status of the read operation. It should be noted that output signal DOUTDn is the signal of the complementary bit.

During the first half of the second clock cycle, enable signal WLOAD is set to a logic low level in preparation for refreshing the complementary bits of the entire word.

During the second half of the second or subsequent clock cycle, the complementary bits for the entire or whole word are refreshed. Status control signal DSIBWn remains at a logic high level and, during the second half of the second clock cycle, enable signal RFCBIT is pulsed to a logic high level. Thus, a logic low level is placed on node G1, which logic low level sets corresponding latches 210 in I/O buffer circuits 118–132. For example, if bit n has been programmed, status control signal DSIBWn is set to a logic high level and a logic low or zero is stored at node G1. The logic low level or complementary refresh value appearing at node G1 is inverted by latch 270 and appears at node H1. The inverted signal appearing at node H1 is inverted by inverter 278 and transmitted to output terminal 256 via passgate 278, which was activated by setting control signal MAXCBIT to a logic high level and control signal MAXCBITB to a logic low level. Thus, the logic low level refresh signal stored at node G1 is transmitted to output terminal 256 where it becomes input/output (I/O) signal PODINn. I/O signal PODINn serves as an input signal at input terminal 312 (shown in FIG. 5). Also during the second half of the second clock cycle, enable signal WLOAD is set to a logic high level, thereby latching the refresh signal in write latching portion 300. In other words, passgate 310 is opened and the refresh signal is transferred to node G, latched by latch 334, and appears at output terminal 350 as output signal DOUTDn. Output signal DOUTDn updates or refreshes the corresponding bit of the word. Thus, the updated latch value is written from data I/O circuit 100 to a memory location in memory array 16 in response to enable or control signal DSIBWn which is indicative of the data value and in response to enable or control signal RFCBIT which is indicative of the status of the read operation. It should be noted that output signal DOUTDn is the output signal of the complementary bit.

During a third clock cycle, the low byte of the word is refreshed. In the first half of the third clock cycle, a control signal DLBL is maintained at a logic low level so that passgates 210 of the corresponding I/O buffer circuits 102–116, i.e., the low byte, are not opened. For bits of the low byte of the stored word that have been programmed and are to be refreshed, status control signal DSIBWn is raised to a logic high level. In addition, enable signals RFNBIT and RFRESHENL are pulsed to a logic high level. More particularly, RFNBIT is pulsed to a logic high level during the first half of the third clock cycle, thereby placing memory system 10 in the READ refresh mode to refresh the normal bits of the low byte. Likewise, during the first half of the third clock cycle RFRESHENL is pulsed to a logic high level to allow the bits located in the high byte of the stored word having a logic low or zero value to set corresponding latches 204 in I/O buffer circuits 102–116. For example, if bit n has been programmed, status control signal DSIBWn is set to a logic high level, refresh enable signal RFRESHENL is pulsed to a logic high level and a logic low or zero is stored at node G2. Control signal DLBH is pulsed high to allow input data DINDn to be ORed with the logic low value appearing at node G2 to generate an updated latch value. This updated latch value is also referred to as a refresh value. Thus, a logic operation, i.e., an Oring operation, is performed on a value from the first memory location, i.e., the value appearing at node G2 and data value DINDn. The refresh value appearing at node G2 is inverted by latch 234 and appears at node H2. The logic low level appearing at node G2 is inverted by latch 234 and appears at node H2. The inverted signal appearing at node H2 is inverted by inverter 248 and transmitted to output terminal 256 via passgate 250, which was activated by setting control signal MAXCBIT to a logic low level and control signal MAX-CBITB to a logic high level. Thus, the logic low level refresh signal stored at node G2 is transmitted to output terminal 256 where it is referred to as input/output (I/O) signal PODINn. I/O signal PODINn serves as an input signal at input terminal 312 (shown in FIG. 5). During the second half of the third clock cycle, enable signal WLOAD is set to a logic high level and enable signal RFNBIT is set to a logic low level, thereby latching the refresh signal in write latching portion 300. In other words, passgate 310 is opened and the refresh signal is transferred to node G, latched by latch 334, and appears at output terminal 350 as output signal DOUTDn. Output signal DOUTDn updates or refreshes the corresponding bit of the word. Thus, the updated latch value is written from data I/O circuit 100 to a memory location in memory array 16 in response to enable or control signal DSIBWn which is indicative of the data value and in response to enable or control signal RFNBIT which is indicative of the status of the read operation. It should be noted that output signal DOUTDn is the signal for the complementary bit. It should be understood that the clock cycles have been numbered as first, second, and third merely for the sake of clarity and the numbering is not a limitation of the present invention. In other words, the clock cycle numbering illustrates the relative timing relationship of the clock cycles and not the actual clock cycle number.

By now it should be appreciated that a memory device and a method for refreshing the memory device have been provided. An advantage of the present invention is the that the complementary data bits are refreshed or updated when the normal data bits and the dynamic reference cells are updated. This allows the threshold voltage of the dynamic reference cell to track the threshold voltages of both the normal data bit and the complementary data, thereby ensuring the integrity of the data stored in the memory device.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method for refreshing a memory device, comprising:
   providing a memory cell having first and second memory locations;
   generating a first updated latch value for a normal bit of a byte;
   writing the first updated latch value to the first memory location during a clock cycle;
   generating a second updated latch value for a complementary bit of a byte; and
   writing the second updated latch value to the second memory location during a subsequent clock cycle.

2. The method of claim 1, wherein generating the first updated latch value includes performing a logic operation on a value of the first memory location and a first data value.

3. The method of claim 2, wherein generating the second updated latch value includes performing a logic operation on a value of the second memory location and a second data value.

4. The method of claim 2, wherein performing the logic operation includes ORing the value of the first memory location and the first data value.

5. The method of claim 4, wherein generating the second updated latch value includes performing a logic operation on a value of the second memory location and a second data value.

6. The method of claim 5, wherein performing the logic operation includes ORing the value of the second memory location and the second data value.

7. The method of claim 1, wherein writing the first updated latch value to the first memory location includes latching the first updated latch value in response to at least one control signal.

8. The method of claim 7, wherein the at least one control signal comprises a first control signal indicative of a value of a first data value and a second control signal indicative of a status of a read operation.

9. The method of claim 8, wherein writing the second updated latch value to the second memory location includes latching the second updated latch value in response to at least one control signal.

10. The method of claim 9, wherein the at least one control signal comprises a first complementary control signal indicative of a value of the second data value and a second complementary control signal indicative of a status of the read operation.

11. A method for operating a memory device, comprising:
    refreshing a normal bit of a byte stored in the memory device during a clock cycle; and
    refreshing a complementary bit of the byte stored in the memory device during a different clock cycle.

12. The method of claim 11, wherein refreshing the normal bit comprises:
    receiving first and second control signals at a first latch of the memory device;
    latching a logic value of the normal bit at a first node in response to the first and second control signals;
    generating a first update value by performing a logic function on the logic value and a first data value; and
    transmitting the first update value of the normal bit to an output terminal of the first latch in response to a third control signal.

13. The method of claim 12, further including transmitting the first update value of the normal bit to an output terminal of a second latch in response to a fourth control signal.

14. The method of claim 13, wherein refreshing the complementary bit comprises:
    receiving the first and fifth control signals at a second latch of the memory device;
    latching a second update value of the complementary bit at a second node in response to the first and fifth control signals; and
    transmitting the second update value of the complementary bit to an output terminal of the second latch in response to a sixth control signal.

15. The method of claim 11, wherein the different clock cycle is a subsequent clock cycle.

16. The method of claim 11, wherein the clock cycle is a subsequent clock cycle.

17. A method for refreshing a memory device, comprising:
- providing the memory device having a data latch, a complementary data latch, and a write latch;
- applying first and second control signals to the data latch, wherein the first control signal represents a programming status of a memory location;
- latching a memory value in the data latch in response to the first and second control signals;
- performing a logic operation on the memory value and a data value to generate a refresh value;
- transmitting the refresh value to an output terminal of the write latch;
- applying the first control signal and a third control signal to the complementary data latch;
- latching a complementary refresh value in the complementary data latch in response to the first control signal and a third control signal; and
- transmitting the complementary refresh value to the output terminal of the write latch.

18. The method of claim 17, wherein performing the logic operation on the memory value and the data value includes ORing the memory value and the data value to generate the refresh value.

19. The method of claim 18, further including transmitting the refresh value at the first node of the data latch to an output terminal of the data latch in response to a fourth control signal.

20. The method of claim 19, further including transmitting the logic low level at the first node of the data latch to an output terminal of the write latch in response to a fifth control signal.

21. The method of claim 20, wherein applying the first and third control signals produces a logic low level at a first node of the complementary data latch.

22. The method of claim 21, further including transmitting the logic low level at the first node of the complementary data latch to the output terminal of the data latch in response to the fourth control signal.

23. The method of claim 22, further including transmitting the logic low level at the first node of the complementary data latch to the output terminal of the write latch in response to the fifth control signal.

24. The method of claim 23, wherein the logic low level at the first node of the data latch is produced during the first half of a first clock cycle, the logic low level at the first node of the data latch is transmitted to the output terminal of the write latch during a second half of the first clock cycle, the logic low level at the first node of the complementary data latch is produced during the first half of a second clock cycle, and the logic low level at the first node of the complementary data latch is transmitted to the output terminal of the write latch during a second half of the second clock cycle.

* * * * *

UNITED STATES PATENT AND TRADEMARK OFFICE
CERTIFICATE OF CORRECTION

PATENT NO. : 6,973,003 B1
APPLICATION NO. : 10/677073
DATED : December 6, 2005
INVENTOR(S) : Salleh et al.

It is certified that error appears in the above-identified patent and that said Letters Patent is hereby corrected as shown below:

In the drawings,
Sheet 2, Fig. 3, replace "SETWB" with --SETBWB-- (two occurances);
Sheet 2, Fig. 3, replace "PZAPO" with --PZAPD-- (two occurrances);
Sheet 3, Fig. 4, add node reference --H1--;
Sheet 3, Fig. 4, add node reference --H2--.

Signed and Sealed this

Fifth Day of June, 2007

JON W. DUDAS
*Director of the United States Patent and Trademark Office*